(12) United States Patent
Portmann et al.

(10) Patent No.: US 7,916,063 B1
(45) Date of Patent: Mar. 29, 2011

(54) CHARGE-SHARING DIGITAL TO ANALOG CONVERTER AND SUCCESSIVE APPROXIMATION ANALOG TO DIGITAL CONVERTER

(75) Inventors: Clemenz Portmann, Mountain View, CA (US); Christoph Lang, Cupertino, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/568,172

(22) Filed: Sep. 28, 2009

(51) Int. Cl.
*H03M 1/34* (2006.01)
(52) U.S. Cl. .................................... 341/163; 341/155
(58) Field of Classification Search .............. 341/155, 341/144, 136, 163, 172
See application file for complete search history.

(56) References Cited

U.S. PATENT DOCUMENTS

| | | | | |
|---|---|---|---|---|
| 7,151,475 | B2 * | 12/2006 | Boemler | 341/155 |
| 7,446,806 | B2 * | 11/2008 | Carlson et al. | 348/308 |
| 7,696,911 | B2 * | 4/2010 | Tsuchi | 341/136 |
| 7,804,434 | B2 * | 9/2010 | Stoutjesdijk | 341/150 |

OTHER PUBLICATIONS

Suarez et al., AII-MOS Charge Redistribution Analog-to-Digital Conversion Techniques-Part II, IEEE Journal of Solid-State Circuits, vol. SC-10, No. 6, Dec. 1975, pp. 379-385 (7 pages).
McCreary et al., AII-MOS Charge Redistribution Analog-to-Digital Conversion Techniques—Part I, IEEE Journal of Solid State Circuits, Dec. 1975, pp. 371-379, vol. SC-10 No. 6 (9 pages).
Pelgrom et al., Matching Properties of MOS Transistors, IEEE Journal of Solid State Circuits, Oct. 1989, pp. 1433-1440, vol. 24 No. 5 (8 pages).
Van De Plassche, Rudy, CMOS Integrated Analog-to-Digital and Digital-to-Analog Converters 2nd Edition, 2003, pp. 289-302, Kluwer Academic Publishers, Boston (34 pages).
Craninckx et al., A 65fj/Conversion-Step 0-50MS/s to 0 to 0.7 mW 9b Charge Sharing SAR ADC in 90nm Digital CMOS, International Solid State Circuits Conference Digest of Technical Papers, Feb. 2007, pp. 246-247, Session 13, Belgium (3 pages).
Giannini et al., An 820μW 9b 40MS/s Noise-Tolerant Dynamic-SAR ADC in 90nm Digital CMOS, International Solid State Circuits Conference Digest of Technical Papers, Feb. 2008, pp. 238-239, Session 12, Lecce Italy (3 pages).

* cited by examiner

*Primary Examiner* — Peguy JeanPierre
(74) *Attorney, Agent, or Firm* — Maginot, Moore & Beck

(57) ABSTRACT

In one embodiment, an analog to digital converter includes a comparator having a first input, a second input and an output, the first input being coupled to an analog signal, a successive approximation register having a serial input coupled to the output of the comparator, and being configured to generate a plurality of control signals and an N-bit digital value corresponding to the analog signal, and a digital to analog converter having an input coupled to the plurality of control signals, the digital to analog converter further comprising a first, a second, and a third capacitor and a plurality of switches controlled by the plurality of control signals and being configured to couple the first capacitor to the second capacitor and the third capacitor to the second capacitor mutually exclusively to share charge on the first capacitor and charge on the third capacitor with charge on the second capacitor and to generate an analog signal on the second capacitor, the second capacitor being coupled to the second input of the comparator.

20 Claims, 12 Drawing Sheets

FIG. 1 – Prior Art (N bit ADC)

FIG. 2 – Prior Art (Serial charge redistribution D/A converter)

FIG. 9A (RESET)

FIG. 9B (Pump-Up)

FIG. 9C (Pump-Down)

US 7,916,063 B1

CHARGE-SHARING DIGITAL TO ANALOG CONVERTER AND SUCCESSIVE APPROXIMATION ANALOG TO DIGITAL CONVERTER

FIELD OF THE INVENTION

The present invention relates generally to electronics and more particularly to analog and digital signal converters.

BACKGROUND OF THE INVENTION

Electronic components have been developed that convert analog to digital signals and vice versa. These converters are used in applications that receive inputs from analog sensors and/or in cases where digital signals are used to interface with analog components. An analog to digital converter (hereinafter referred to "ADC"), converts an analog voltage to a digital number. A digital to analog converter (hereinafter referred to "DAC"), converts a digital number to an analog equivalent signal.

In certain applications the speed of the signal conversions is controlling. In some of these cases, the converter must be able to keep up with rapidly changing data. In other applications the ability to resolve between two close analog voltages is controlling. The number of bits that make up the digital number as well as the reference voltage used to implement the ADC/DAC determine the resolution of the ADC/DAC. For example, an eight-bit ADC/DAC ranges from 0 to 255, i.e., 256 values. If the highest number, i.e., 255, is scaled to 5 V, i.e., the reference voltage, the resolution of the ADC/DAC is 19.58 mV. That is, the ADC/DAC can only resolve to within 19.58 mV. If, for the same reference voltage, a ten-bit result is generated the resolution is thereby improved to 4.88 mV.

In some other applications the footprint of the converter is the most important factor. In these cases, the objective is to make the size of the ADC or DAC as small as possible within the geometrical constraints of the semiconductor technology being used. For example, the number of capacitors used in an ADC/DAC may result in a large footprint for the ADC/DAC. FIG. 1 shows an example of the front end of an N-bit DAC found in the prior art. Capacitors are switched in and out to adjust the output of the DAC (daco). The number of capacitors in this type of implementation is N+1, where N is the number of bits. Furthermore, these capacitors must be binary weighted and are usually implemented with a unit capacitor. Thus, the actual implementation requires 1024 capacitors. These capacitors must match to avoid conversion inaccuracies. For example, each successive bit or resolution requires the matching to improve by a factor of 2×. Since matching capacitors in semiconductor technology is proportional to the square root of the area of the capacitors, every additional bit of resolution requires an increase in the capacitor area of 4×.

Serial charge redistribution digital to analog converters were developed to address some of these shortcomings. FIG. 2 shows an example of a prior art D/A converter including two capacitors and three switches that has a smaller footprint than the converter of FIG. 1. However, serial D/A converters, such as the one shown in FIG. 2 are excessively slow for certain applications, and suffer from non-ideal behavior due to charge injection from the switches.

What is needed is an ADC/DAC converter that provides sufficiently fast conversions, with sufficiently fine resolution, a small footprint, and reduces the non-ideal behavior of switches.

SUMMARY OF THE INVENTION

In one embodiment, an analog to digital converter includes a comparator having a first input, a second input and an output, the first input being coupled to an analog signal, a successive approximation register having a serial input coupled to the output of the comparator, and being configured to generate a plurality of control signals and an N-bit digital value corresponding to the analog signal, and a digital to analog converter having an input coupled to the plurality of control signals, the digital to analog converter further comprising a first, a second, and a third capacitor and a plurality of switches controlled by the plurality of control signals and being configured to couple the first capacitor to the second capacitor and the third capacitor to the second capacitor mutually exclusively to share charge on the first capacitor and charge on the third capacitor with charge on the second capacitor and to generate an analog signal on the second capacitor, the second capacitor being coupled to the second input of the comparator.

In another embodiment, an analog to digital converter includes a first adder configured to generate a sum of a first analog signal and a second analog signal, a second adder configured to generate a sum of a third analog signal and a fourth analog signal, a comparator configured to compare the sum of the first and the second analog signals with the sum of the third and the fourth analog signals, a successive approximation register coupled to the comparator and being configured to generate a plurality of control signals and an N-bit digital value corresponding to the first and the third analog signals in response to the comparison performed by the comparator, and a differential digital to analog converter coupled to the plurality of control signals, the digital to analog converter further comprising a first, a second, a third, and a fourth capacitor and a plurality of switches controlled by the plurality of control signals and being configured to couple the first and the third capacitors to the second capacitor, and to couple the first and the third capacitors to the fourth capacitor in a mutually exclusively manner to share charge on the first capacitor and charge on the third capacitor with charges on the second and fourth capacitors and to generate the second analog signal on the second capacitor and the fourth analog signal on the fourth capacitor.

In another embodiment, an analog to digital converter includes a first adder configured to generate a sum of a first analog signal and a second analog signal, a second adder configured to generate a sum of a third analog signal and a fourth analog signal, a comparator configured to compare the sum of the first and the second analog signals and the sum of the third and the fourth analog signals, a successive approximation register coupled to the comparator and being configured to generate a plurality of control signals and an N-bit digital value corresponding to the first and the third analog signals in response to the comparison performed by the comparator, and a differential digital to analog converter coupled to the plurality of control signals, the differential digital to analog converter further comprising a first, a second, a third, and a fourth capacitor and a plurality of switches controlled by the plurality of control signals to toggle selectively between a first sequence and a second sequence, in the first sequence the plurality of switches couple the first and the third capacitors to the second capacitor and couple the first and the third capacitors to the fourth capacitor in a mutually exclusively manner to share charge on the first capacitor and charge on the third capacitor with charges on the second and fourth capacitors and to generate the second analog signal on the second capacitor and the fourth analog signal on the fourth capacitor, in the second sequence the plurality of switches couple the second and the fourth capacitors to the first capacitor and couple the second and the fourth capacitors to the third capacitor in a mutually exclusively manner to share charge on the second capacitor and charge on the fourth capacitor with charges on the first and the third capacitors and to generate the second analog signal on the first capacitor and the fourth analog signal on the third capacitor.

The above described features and advantages, as well as others, will become more readily apparent to those of ordinary skill in the art by reference to the following detailed description and accompanying drawings.

DETAILED DESCRIPTION

Figure 3:
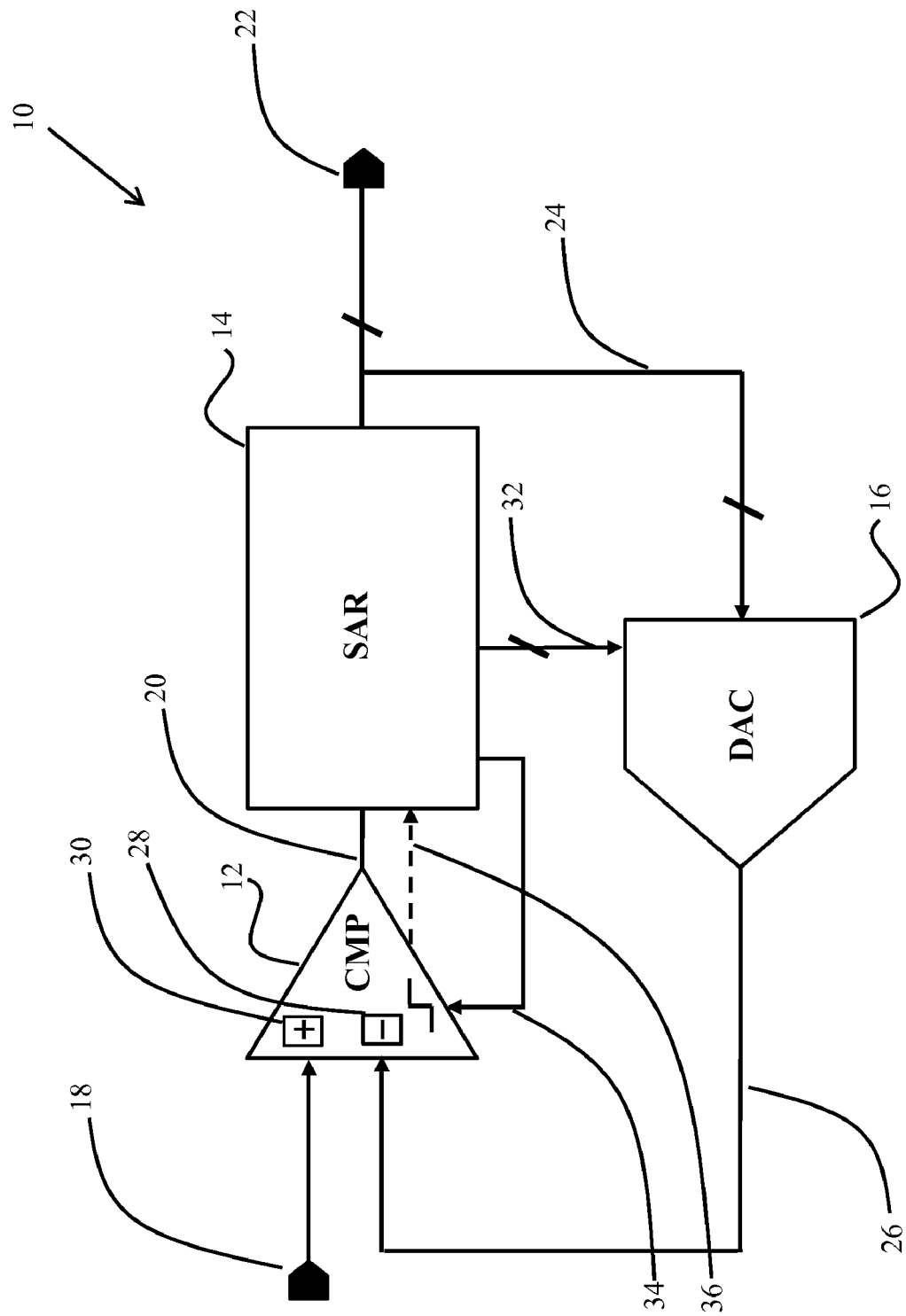
FIG. 3 is a block diagram representation of component connectivity for one embodiment according to the current teachings.

Referring to FIG. 3, a block diagram of an ADC 10 according to the current teachings is provided. A digital output is provided at the ADC's output 22 for an analog input 18. The analog input 18 is compared with output 26 of a DAC 16 by comparator 12. The analog input 18 is fed to the positive terminal 30 of the comparator 12, while the DAC's output 26 is fed to the negative terminal 28. If the DAC output 26 is higher than the analog input 18, the comparator output 20 is low, i.e., a digital zero. If the DAC output 26 is lower than the analog input 18, the comparator output 20 is high, i.e., a digital one. The output 20 of the comparator 12 is fed to a successive approximation register 14 (hereinafter referred to as "SAR"). The SAR 14 controls the DAC 16 by a number of control lines 32. The SAR 14 also provides the DAC 16 with a digital input 24. Over several iterations, the SAR 14 controls the DAC 16 by way of control lines 32 while providing input lines 24 to arrive at an analog signal, i.e., the DAC's output 26, that is within the resolution of the ADC 10. When the SAR 14 has completed these iterations, SAR's output, i.e., DAC's input lines 24, are read by a downstream component (not shown) on the ADC output 22. In one embodiment, a trigger signal 34 is provided to the comparator 12 that can be used by the comparator to determine when the DAC output 26 is ready for comparison with the analog input 18. The trigger signal 34 can be a strobe that pulses to a digital high when the DAC output 26 is ready and returns to a digital low at some predetermined time thereafter. Alternatively, the trigger signal can be a clock. For example, the trigger signal 34 can be a phase-shifted clock, phase shifted from a clock (not shown), which is operating the SAR 14. In this embodiment, the trigger signal 34 can be the falling edge of the clock, while the next rising edge of the clock can be used by the SAR 14 as a triggering signal to capture the output of the comparator 12. Correspondingly, a data ready signal 36 can be provided by the comparator 12 to the SAR 14 to alert the SAR 14 when the comparator output is ready. The data valid signal 36 can be used in an asynchronous fashion by the SAR 14 to capture the output 20 of the comparator 12. The comparator 12 can use a latch mechanism, e.g., an S-R latch to latch the output 20 of the comparator 12 at the same time as when the data ready signal 36 becomes a digital high.

Figure 4:
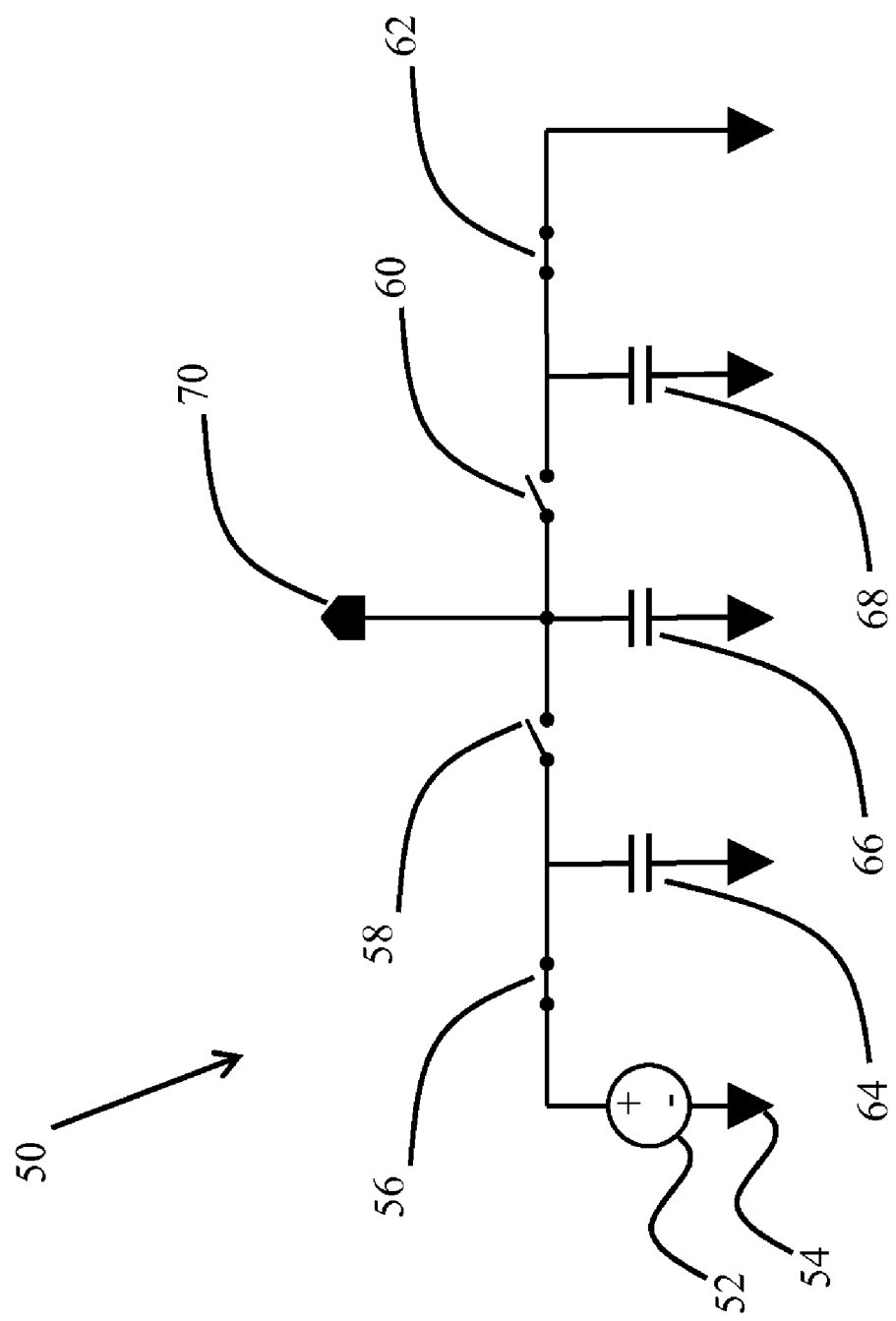
FIG. 4 is a schematic representation of the capacitor connectivity according to the current teachings.

Referring to FIG. 4 an exemplary circuit 50 showing connectivity between capacitors according to the current teachings is provided. In this exemplary embodiment four switches 56, 58, 60, and 62 and three capacitors 64, 66, and 68 are needed regardless of the resolution of the DAC, i.e., the number of output bits. That is, whether the DAC is an eight-bit DAC or a ten-bit DAC the same components are used. The switches are digitally controlled by control lines 32. In the on state, i.e., logical level one, the switches are engaged. In the off state, i.e., the logical level zero, the switches are open. The output voltage of the DAC is measured at the capacitor 66. Switches 56, 58, 60, and 62 are provided to allow selective charge sharing between capacitors 64, 66, and 68. Although as shown in FIG. 4, switch 62 provides connectivity to ground 54, the circuit can also be configured so that switch 62 is connected to a low reference voltage, i.e., a level different than ground 54. Capacitors 66 and 64 form a first pair of charge sharing capacitors. Capacitors 66 and 68 form a second pair of charge sharing capacitors. At different times these two pairs of capacitors share their charges in a mutually exclusive fashion, described in a greater detail, below.

Figure 1:
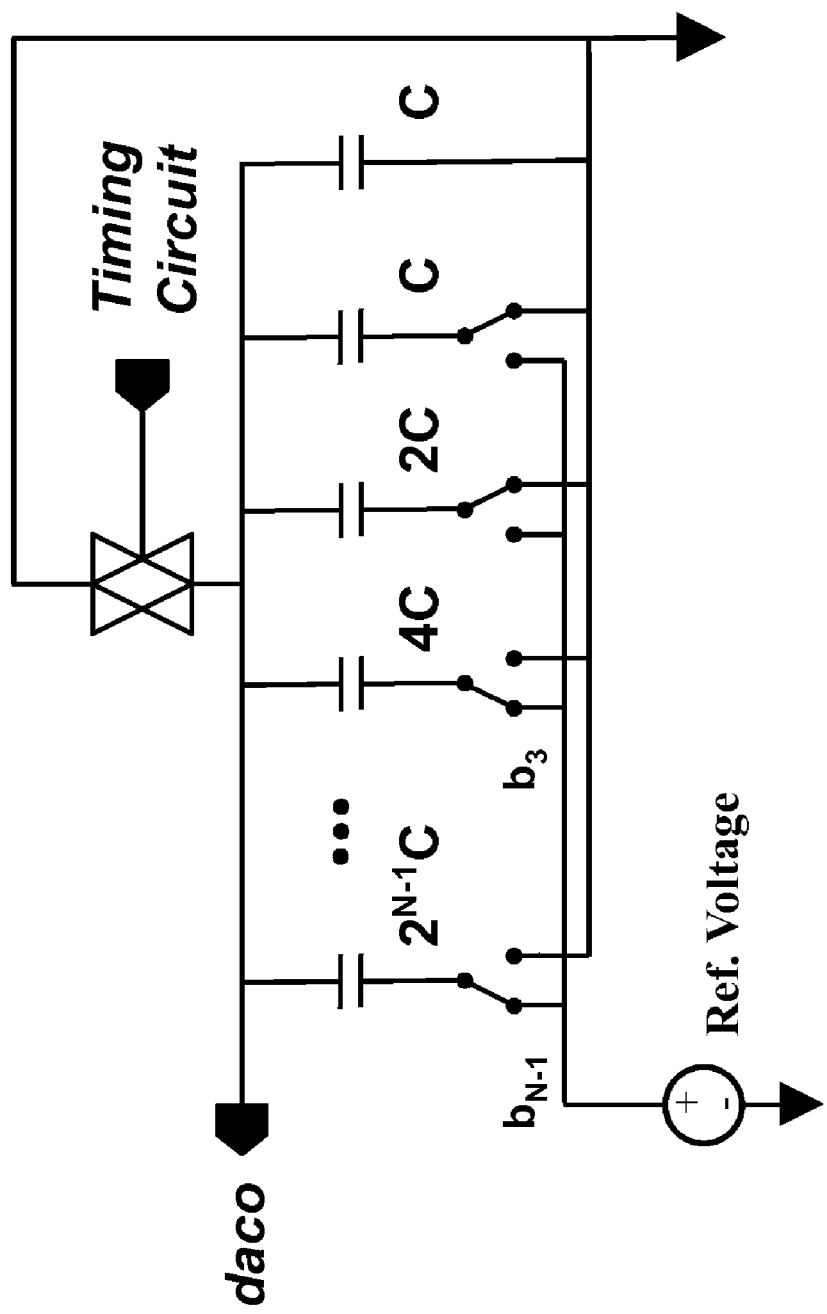
FIG. 1 figure shows the front end of a prior art N-bit ADC.
Figure 2:
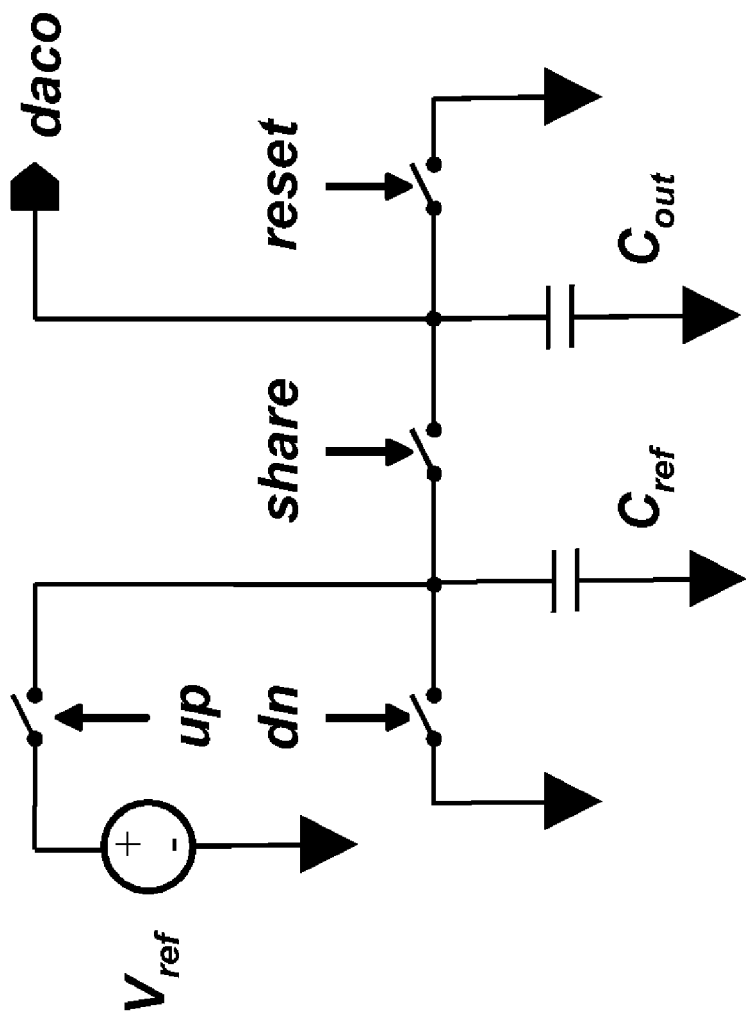
FIG. 2 figure shows a prior art serial charge redistribution D/A converter.

The circuit 50 is an improvement over the prior art shown in FIG. 2. In circuit 50, while the first set of capacitors, i.e., capacitors 64 and 66, are sharing charge, capacitor 68 discharges its charge by way of its connection to ground. Similarly, while the second set of capacitors, i.e., capacitors 66 and 68, are sharing charge, capacitor 64 charges by way of its connection to a high reference voltage 52. Therefore, the charge sharing is improved over the prior art since there is no need to wait for a charge sharing capacitor ($C_{ref}$ in FIG. 2) to charge or discharge. Additionally, capacitors 64 and 68 can be charged to fixed reference voltage values independent of the comparator output. This independence allows charging/discharging to take place for capacitors 64 and 68 earlier in time as compared to the charge sharing capacitor $C_{ref}$ of FIG. 2. The ability to charge/discharge earlier in time is advantageous since the SAR 14 needs to know the comparator output to determine the voltage to which $C_{ref}$ is set. Finally, capacitors 64 and 68 at most have to charge to $V_{ref}$ from $V_{ref}/2$ or discharge from $V_{ref}/2$ to ground. These lower charging/discharging ranges are an improvement over the single capacitor $C_{ref}$ of FIG. 2. This improvement is realized since $C_{ref}$ must be charged to $V_{ref}$ from near ground (actually, $$\frac{2^{n-1}-1}{2^{n-1}}V_{ref},$$

where n is the number of bits) or discharged from about $V_{ref}$ (actually, $$\frac{2^{n-1}-1}{2^{n-1}}V_{ref},$$

where n is the number of bits) to ground. Therefore, in circuit 50 as soon as charge between one pair of capacitors is shared during a charge sharing cycle, the third capacitor is ready to share its charge during the next charge sharing cycle.

There are four distinct states in the circuit 50. In the first state a first capacitor 64 is charged by coupling it to the high reference voltage 52 by placing the first switch 56 in the on state. In this state, a second switch 58 is in the off state to decouple a second capacitor 66 from the first capacitor 64. In the second state charge between the second capacitor 66 and either the first capacitor 64 or a third capacitor 68 is shared. If the first capacitor 64 is sharing charge with the second capacitor 66, the first switch 56 is in the off state, the second switch 58 is in the on state, and a third switch 60 is in the off state. If the second capacitor 66 is sharing charge with the third capacitor 68, the second switch 58 is in the off state, the third switch 60 is in the on state, and a fourth switch 62 is in the off state. In the third state, the third capacitor 68 is discharged by coupling it to ground 54 by placing the fourth switch 62 in the on state. In this state, the third switch 60 is in the off state to decouple the second capacitor 66 from the third capacitor 68. In the fourth state, the second capacitor 66 is discharged by placing the third switch 60 and the fourth switch 62 in the on state and by decoupling the first capacitor 64 by placing the second switch 58 in the off state. In addition, the fourth state can be implemented with an additional reset switch.

The high reference voltage 52 having an electrical potential with respect to ground 54 provides charge to the capacitor network 64, 66, and 68. The high reference voltage 52 is switched in and out of the capacitor network by the first switch 56. The high reference voltage 52 charges the first capacitor 64. While switch 56 connects the first capacitor 64 to the high reference voltage 52, the second switch 58 is in the open state, uncoupling a second capacitor 66 from the first capacitor 64. That is, the second switch 58 and the first switch 56 are on in a mutually exclusive manner. While the second switch 58 is in the on state, the charge between the first capacitor 64 and the second capacitor 66 is shared. In this state, the second capacitor 66 is decoupled from the third capacitor 68.

Charge sharing between the capacitor pairs, e.g., the first capacitor 64 and the second capacitor 66, is governed by equation (1).

$$Q_{1,2} = \frac{C_1 V_{init1} + C_2 V_{init2}}{2}, \quad (1)$$

where $C_1$ and $C_2$ are the capacitances of the first capacitor 64, the second capacitor 66, $V_{init1}$ and $V_{init2}$ are the voltages of the first and second capacitors immediately before charge sharing, and $Q_{1,2}$ is the charge on the first and second capacitors $C_1$ and $C_2$. For $C_1=C_2=C$, the charge on the capacitors is shown by equation (2).

$$Q_{1,2} = \frac{C(V_{init1} + V_{init2})}{2}. \quad (2)$$

The final voltage on the first and second capacitors, is governed by equation (3).

$$V_{Final1,2} = \frac{Q_{1,2}}{C}. \quad (3)$$

Substituting for $Q_{1,2}$ in equation 3, $V_{Final1,2}$ is calculated based on equation (4).

$$V_{Final1,2} = \frac{(V_{init1} + V_{init2})}{2}. \quad (4)$$

Therefore, for cases where $C_1=C_2$, every time the charge on the first and second capacitors are shared, the post-charge-sharing voltage on both capacitors is an average of $V_{init1}$ and $V_{init2}$. The same holds true for charge sharing between the second and third capacitors 66 and 68.

Figure 5:
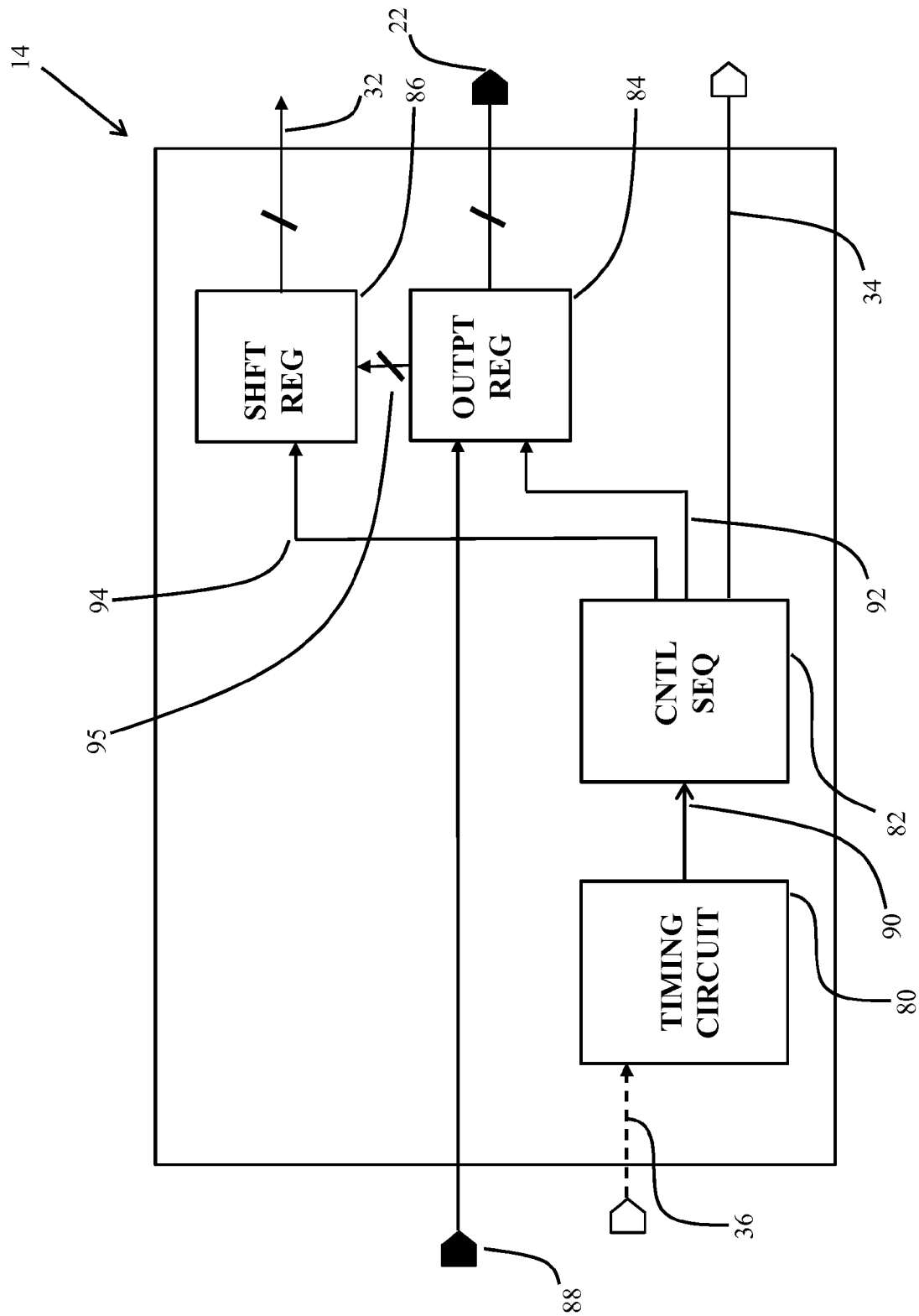
FIG. 5 is a block diagram representation of one of the components shown in FIG. 3.

Referring to FIG. 5, internal structure of the SAR 14 is shown. Input 88 is coupled to the comparator output (not shown). The digital bits at input 88 are captured by an output register 84. The comparator continuously outputs a digital one or zero. The comparator's output is captured at particular instances of time by the output register 84 under the control of control sequence circuit 82. The control sequence circuit 82 outputs timing control signal 92 which triggers capture of bits at input 88. The control sequence circuit is triggered by a timing signal 90 being generated by a timing circuit 80. The output register 84 is a register having N bits representing the N bits of the ADC 10. These N bits are presented at the ADC's output 22 over data lines 24. The output register 84 can optionally provide the N bits at the ADC's output 22 when the ADC has reached the digital equivalent of the analog input 18 within the resolution of the ADC. Alternatively, the output register 84 can continuously change the data lines 24 and thereby change the ADC's output 22. In the latter embodiment, a data valid flag may be necessary to alert downstream components when the data is valid.

The control sequence circuit 82 is configured to trigger the capture of the next bit available at the input 88 (which is connected to the comparator 12 and represents the output 20 of the comparator 12) after a certain amount of time has expired. In one embodiment, this delay can be accomplished by circuit 82 counting a predetermined number of clock cycles of the timing signal 90, which was generated by the timing circuit 80. In another embodiment, the timing circuit 80 may be a timer, i.e., an RC circuit, which provides a decaying signal to the control sequence circuit 82. In yet another embodiment, a data ready signal 36 can be provided by the comparator 12 to alert the timing circuit 80 that the output 20 of the comparator 12 has valid data. In any of these cases, the control sequence circuit 82 triggers the output register 84 to capture the data at the input 88 only when the data is valid.

The output register 84 provides data lines 95 to a shift register 86. The shift register 86 shifts data in a fashion that is described below and provides control lines 32 to the DAC (not shown). The shift register is also controlled by the control sequence circuit 82 via timing control signal 94.

Figure 6:
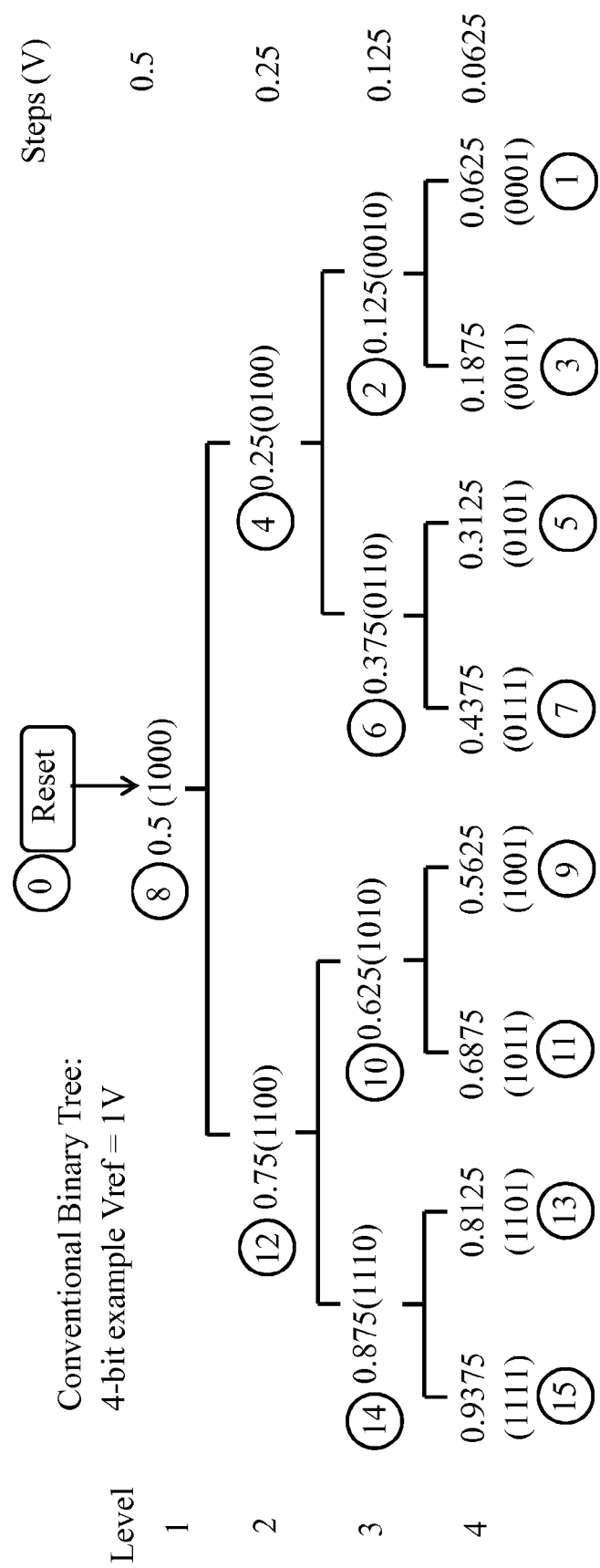
FIG. 6 depicts a conventional exemplary binary tree for a four-bit ADC.

As already discussed, the DAC 16 shown in FIG. 3, has a capacitor network shown in FIG. 4, which includes four switches and three capacitors. Operating the four switches can logically be accomplished according to a binary tree. The binary tree has N levels, where N is the number of ADC/DAC bits, in addition to a reset state. For example a four-bit ADC has four levels and a reset state. Each level logically represents a fractional increment of the reference voltage. Referring to FIG. 6 a conventional 4-bit binary tree is provided. At the root of the tree a rest state is provided representing state 0. Each level represents an incremental step of $V_{ref}/(2^m)$, where m is the level number. Further, each level has $2^{m-1}$ children, where m is the level number. A left child represents the voltage of its parent plus the incremental step, while the right child represents the voltage of its parent minus the incremental step. For example, the first level represents $V_{ref}/2$ and has only one child. If $V_{ref}$ is 1 V, this level represents 0.5 V, which is represented by the binary number 1000. The full range, i.e., +1 V is represented by the binary 1111. The next level represents a step of $V_{ref}/2^2$ (or 0.25 V) and has two children. This left child is 0.5 V+0.25 V (0.75 V) and the right child is 0.5 V−0.25 V (0.25 V). The last level, i.e., level 4, has an incremental step of $V_{ref}/(2^4)$=0.0625 V. This level has $2^3$ children. The incremental step for each level is also found as the right most child in each level. The binary tree shown in FIG. 6 can be implemented using logic gates in accordance to the logical relationship, described above.

The capacitor and switching network in a SAR DAC, which is shown in FIG. 4, does not follow the conventional binary tree provided in FIG. 6. Instead, the capacitor and switching network shown in FIG. 4 follow the binary tree shown in FIG. 7, for a four bit ADC.

Figure 7:
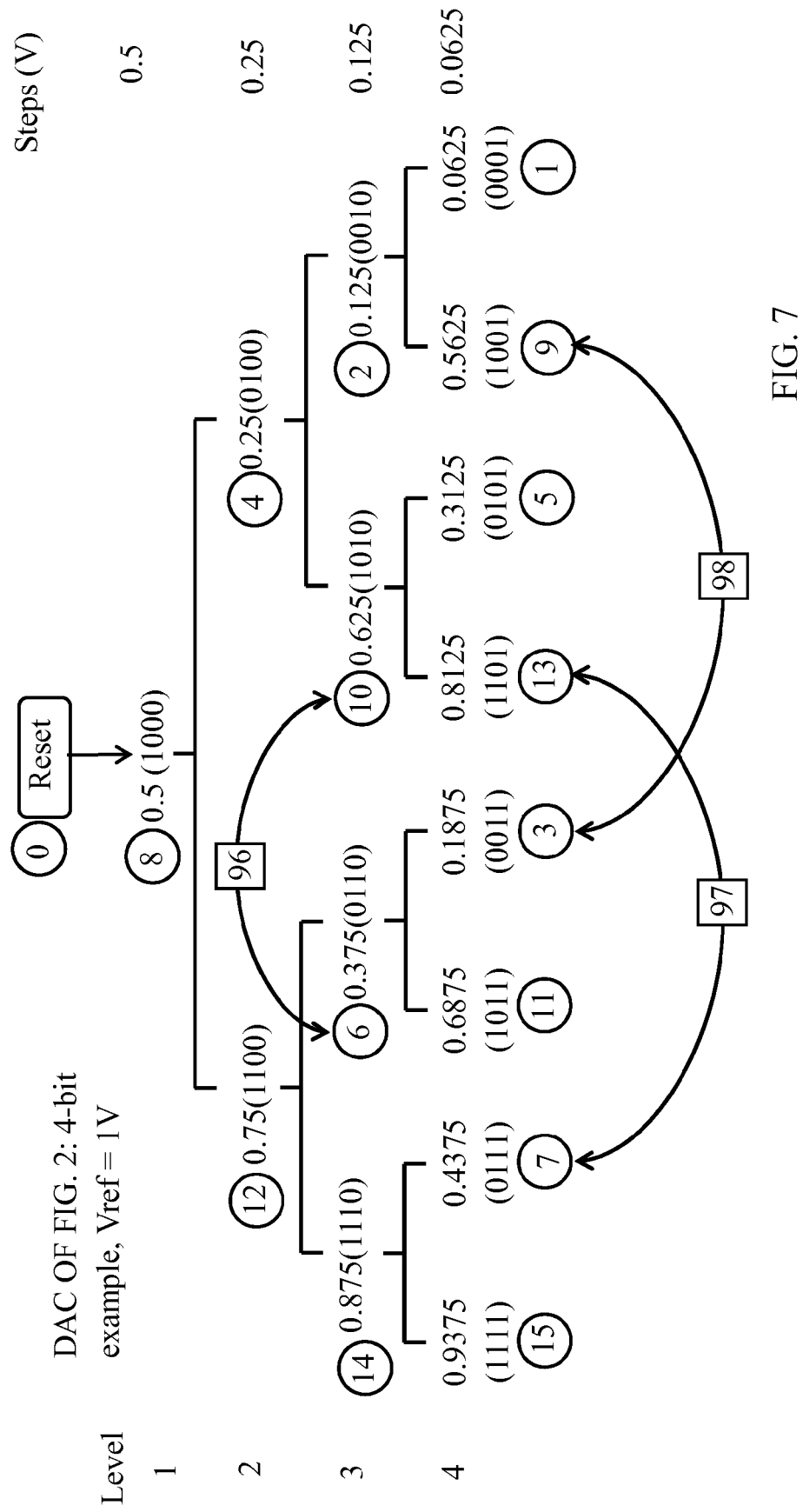
FIG. 7 depicts the binary tree for a four-bit ADC according to the current teachings.

Referring to FIG. 7, a similar binary tree as that shown in FIG. 6 is provided. However, there are distinct differences. At the root of the tree a reset state is provided representing state 0. Each level represents an incremental step of $V_{ref}/(2^m)$, and each level has $2^{m-1}$ children, where m is the level number. In particular, a left child represents the voltage of its parent plus $V_{ref}$ and the quantity divided by two, i.e., $$\frac{V_{parent} + V_{ref}}{2}.$$

However, the right child represents the voltage of its parent divided by two. The child-parent relationship according to FIG. 7 is described below.

Referring to FIGS. 4 and 7, suppose the DAC is at the binary tree location 1100 (12), on level 2 of the tree. The voltage on capacitor 66, i.e., the DAC's output 26, is 0.75 V. At this instance, the switches 56 and 62 are in the on state, while the switches 58 and 60 are in the off state. Upon comparing 0.75 V with the analog input 18, if the output of the comparator is a binary 1, i.e., the analog input has a higher voltage than 0.75 V, the DAC 16 should follow to the next binary level (level 3) and to the left child at that level, i.e., 1110 (14). In order to accomplish this, capacitor 64 which has already been charged to Vref (1 V in these examples), is coupled to the second capacitor 66 for charge sharing. In order for the first and second capacitors 64 and 66 to share their charges, switches 56 and 58 are placed in the off state and the on state, respectively. Based on equation (4), provided above, the voltage on capacitors 64 and 66 settles to $(V_{init1}+V_{init2})/2$, i.e., (1 V+0.75 V)/2=0.875 V. If however, the comparator's output is 0, i.e., the analog input has a lower voltage than 0.75 V, the DAC 16 should follow to the next binary level (level 3) and to the right child at that level, i.e., 0.625 V (1010). In order to accomplish this, capacitor 68 which has already been discharged to ground 54 is coupled to the second capacitor 66 for charge sharing. In order for the second and third capacitors 66 and 68 to share their charges, switch 60 is placed in the on state, while switch 62 is placed in the off state. Based on equation (4), provided above, the voltage on capacitors 66 and 68 settles to $(V_{init1}+V_{init2})/2$, i.e., (0 V+0.75 V)/2=0.375 V. Therefore, the right child of 1100 (0.75 V) in the binary tree of FIG. 7 is different than the one shown in the binary tree of FIG. 6. This difference arises from the right hand side children of FIG. 7 being governed by a different relationship than the right hand side children of FIG. 6.

The latter difference results in several children being in different locations. These are shown by arrows in FIG. 7. For example, in the third level (m=3), there are four children. The positions of the inner children are reversed in FIG. 7 as compared to FIG. 6, as shown by arrow 96. Similarly, in the last level (m=4) four out of the eight children have different positions as compared to FIG. 6, as indicated by arrows 97 and 98. These differences generate unique situations different than the logical relationship discussed in accordance with FIG. 6 and must therefore be addressed.

To resolve these differences, a bit mirror imaging method is implemented in the SAR 14, as described below. This method is exemplified in FIG. 8. The DAC's output settles to the DAC's resolution of the analog input after several iterations. Each $I^{th}$ iteration is divided into I phases, with the first phase always traversing from state 0 to state 8. At the end of each iteration, the output of the comparator 12 is captured by the output register 84 of the SAR 14 and appended to the output of the comparator from the previous phase of that iteration. Mirror image versions of the appended bits are used to construct the next iteration (phase 2 through the last phase of each iteration involved in the traversal of the binary tree according to a mirror image of comparator bits appended up to the last iteration). Starting from state 8, for each bit of the mirror image version of the appended bits if the bit is a zero, a pump-down operation is performed to the next level of the tree. If the bit is a one, a pump-up operation is performed. The reset, pump-up, and pump-down operations are shown in FIGS. 9A-9C.

Figure 8:
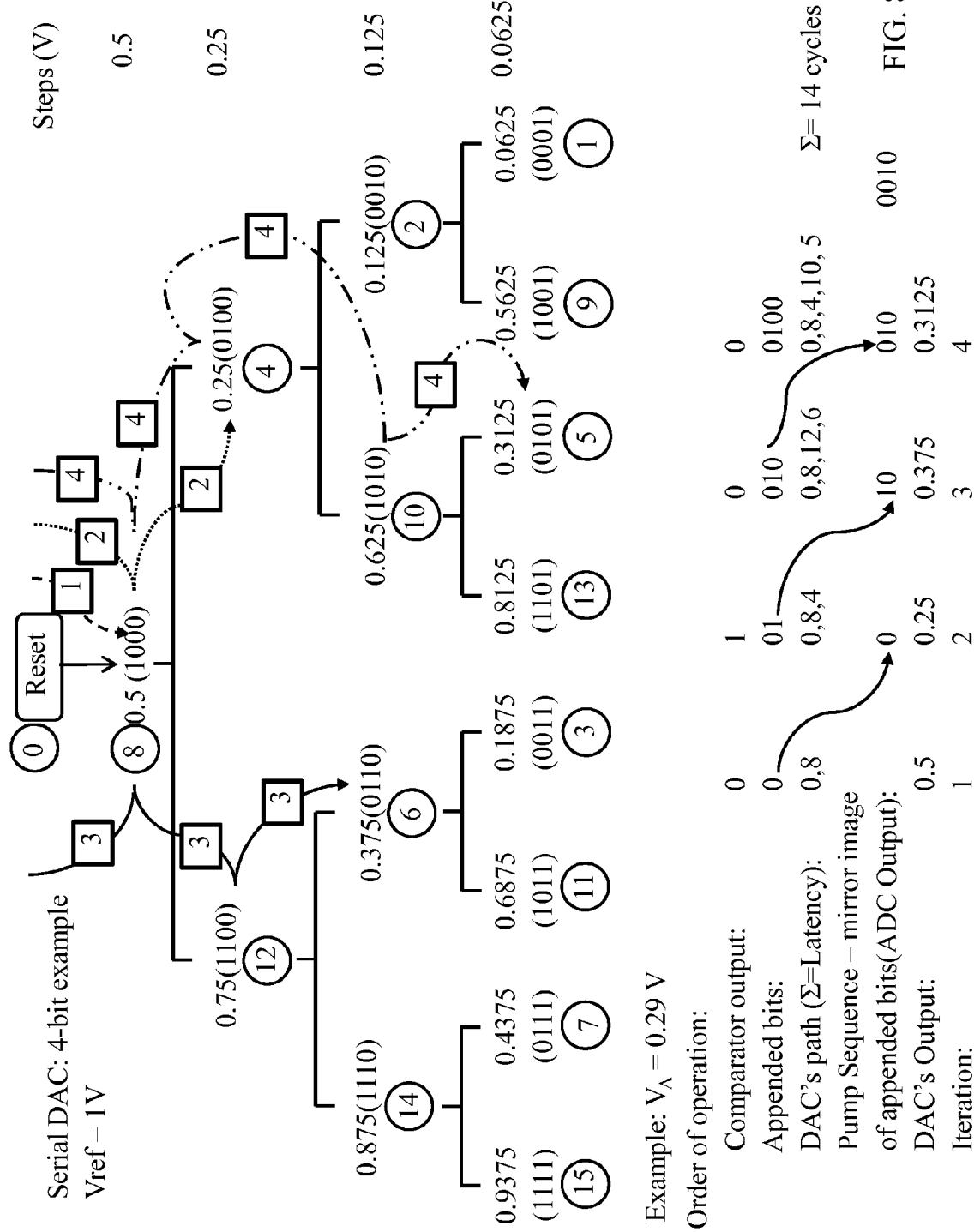
FIG. 8 depicts operational steps for converting an exemplary analog value to a digital value for a four-bit ADC.
Figure 9:
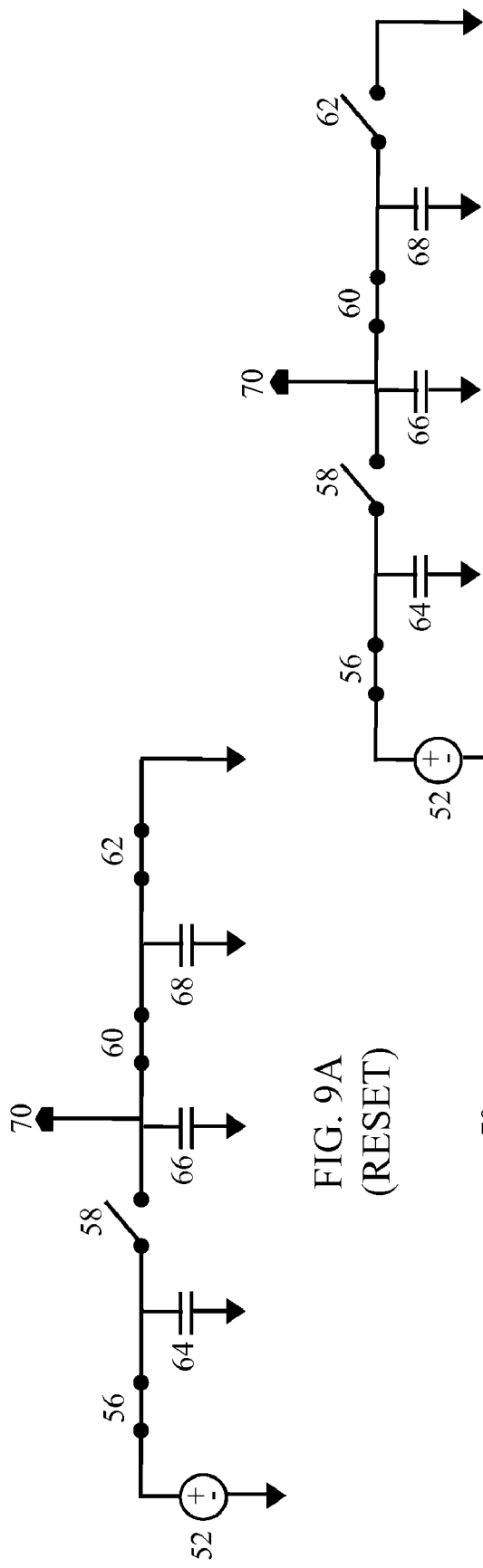
FIG. 9A is a schematic representation of the capacitor connectivity for a reset state according to the current teachings.
FIG. 9B is a schematic representation of the capacitor connectivity for a pump-up procedure according to the current teachings.
FIG. 9C is a schematic representation of the capacitor connectivity for a pump-down procedure according to the current teachings.

Referring to FIG. 8, suppose the analog input has a potential of 0.29 V. The resolution of the four-bit ADC is $V_{ref}/(2^n)$, in this example ¹⁄₁₆ V (0.0625 V). Therefore, the ADC's desired output ($V_{out}$ at reference numeral 22) is 0100, i.e., 0.25 V<$V_{out}$<0.3125 V. The ADC reaches to the desired output in four iterations. The first iteration has only one phase. The ADC starts the first iteration in the reset state (shown as state 0). In the reset state the switches are configured as shown in FIG. 9A. The DAC's first iteration traverses from state 0 (reset state) to 1000, state 8, as shown by dashed line in FIG. 8. To get from state 0 to state 8 a pump-up operation is performed. In the pump-up arrangement the switches are configured as shown in FIG. 9B. At the conclusion of the first iteration the voltage on capacitor 66 is 0.5 V. Since the DAC's output 26 is at 0.5 V and the analog input is at 0.29 V, the comparator's output is low. The output register 84 of the SAR 14, see FIG. 5, captures the output of the comparator. The order of operation is shown at the bottom of FIG. 8. As indicated, the path for the DAC's first iteration is from state 0 to state 8.

The DAC's second iteration has two phases. The second iteration begins at the reset state, state 0, as indicated by the dotted line in FIG. 8. The first phase of the second iteration follows a path from state 0 to state 8, by a pump-up operation. Since the only bit in the output register 84 is a zero, the mirror image of that bit remains a zero, as indicated by the table at the bottom of FIG. 8. This value indicates that the second iteration follows to the right hand side of the binary tree, to state 4. The path from state 8 to state 4 requires a pump-down operation. In the pump-down arrangement the switches are configured as shown in FIG. 9C. At the conclusion of the second iteration the voltage on capacitor 66 is 0.25 V. Since the DAC's output 26 is at 0.25 V and the analog input is at 0.29 V, the comparator's output is high. The output register 84 of the SAR 14 captures the output of the comparator and appends this comparator output to the comparator's output from the first iteration to form the bit combination 01. The SAR 14 determines the mirror image of this bit combination, i.e., 10. This new bit combination is communicated from the output register 84 to the shift register 86 by way of data lines 95, see FIG. 5.

The third iteration has three phases. It begins at state 0 and follows to state 8 by a pump-up operation, as indicated by the solid line in FIG. 8. Thereafter, according to the mirror image bit combination (10), the DAC proceeds first to the left side to state 12 (1100) by a pump-up operation, and then to the right side by a pump-down operation to state 6 (0110). At the conclusion of the third iteration the voltage on capacitor 66 is 0.375 V. Since the DAC's output 26 is at 0.375 V and the analog input is at 0.29 V, the comparator's output is low. The output register 84 of the SAR 14 captures the output of the comparator and appends this comparator output to the comparator's output from the second iteration to form the bit combination 010. The SAR 14 determines the mirror image of this bit combination, i.e., 010. This new bit combination is communicated from the output register 84 to the shift register 86 by way of data lines 95.

The fourth iteration has four phases. It begins at state 0 and follows to state 8 by a pump-up operation, as indicated by the dashed-dotted line in FIG. 8. Thereafter, according to the mirror image bit combination (010), the DAC proceeds first to the right side to state 4 (0100) by a pump-down operation, then to the left side by a pump-up operation to state 10 (1010), and then to the right side to state 5 (0101) by a pump-down operation. At the conclusion of the fourth iteration the voltage on capacitor 66 is 0.3125 V. Since the DAC's output 26 is at 0.3125 V and the analog input is at 0.29 V, the comparator's output is low. The output register 84 of the SAR 14 captures the output of the comparator and appends this comparator's output to the comparator output from the third iteration to form the bit combination 0100. At this point the output register 84 outputs this bit combination to output port 22. As mentioned above, the output register may, alternatively, make the bit combinations available after each iteration. In this implementation, a data ready signal is needed to alert the downstream component as to when the valid data is available on output port 22.

A fixed number of iterations is necessary to arrive at the closest digital conversion. The number of iterations is the same as the number of bits, i.e., N. In the four-bit example shown in FIG. 8, four iterations were necessary to arrive at the closest digital representation. For a ten-bit conversion, ten iterations are necessary. Naturally, the Nth iteration is always in the bottom row of the binary tree. However, the final digital conversion can result somewhere else in the tree. By way of example, if the analog input was 0.76 V, the first iteration results in a comparator output of 1 (comparing 0.5 V to 0.76). The second iteration results in a comparator output of 1 (comparing 0.75 to 0.76). The third iteration results in a comparator output of 0 (comparing 0.875 to 0.76). The fourth and last iteration results in a comparator output of 0 (comparing 0.8125 to 0.76, mirror image of the appended bits is 011). The appended bits results in 1100 which is 12 or 0.75 V. This is the closest digital conversion.

Given that there are a fixed number of iterations, for any analog input, the binary tree shown in FIG. 8 should be traversed according to a fixed number of cycles, resulting in a fixed latency. As discussed above, several charge sharing cycles are needed to arrive at the desired digital equivalent of the analog signal. The number of charge sharing cycles, where each cycle has a predetermined period, forms the latency of the ADC. The latency of the ADC is calculated based on equation 5, provided below.

$$Latency of ADC = N + \sum_{n=1}^{N} n \qquad (5)$$

where, N is the number of ADC bits. In the above four-bit example, the number of cycles is 4+3+2+1+4 which equals 14 cycles. This can be seen in the bottom table of FIG. 8 next to the item titled "DAC's Path." For a ten-bit ADC, the latency is 65 cycles.

In one embodiment, the first phase of the second iteration can be eliminated. This reduction is possible because the mirror image of the captured bit from the comparator's output after the first iteration is always equal to the same bit. In the example provided above, after the first iteration, the captured bit from the comparator's output was a zero. Since the mirror image of a single bit is the same as the bit, the second iteration can start from state 8, instead of starting from the reset state (0) and then traversing to state 8. The elimination of the first phase of the iteration saves latency required for one reset connectivity (see FIG. 9A) and one pump-up operation, i.e., from the reset state to state 8. Therefore, the total number of cycles can be reduced to 12 instead of 14. More generally, equation 5 can be changed to provide a modified latency formula, provided below:

$$\text{Modified } Latency of ADC = N - 1 + \sum_{n=2}^{N} n \qquad (6)$$

In one implementation, the timing for traversing from one state to another is based on a clock cycle. The clock signal is formed, e.g., in the timing circuit 80 and provided to control sequence circuit 82 on timing signal 90. Alternatively, a timer, e.g. an RC circuit, can be used to trigger the control sequence circuit 82 when it is time to move to the next state. Whether a clock or a timer is used, the period between the timing signals 90 should be sufficient so that the charges on the capacitor network settle during pump-up/down operations.

In one embodiment, the SAR 14 can be implemented such that certain phases of a new iteration may be avoided. In this embodiment, if the mirror image of the appended bits places the DAC at the same state that the DAC already is at the end of a current iteration, phases of a new iteration that place the DAC in the current location can be eliminated. For example, if at the conclusion of iteration n, the mirror image of the appended bits would place the DAC at the same state that the DAC already is, then there is be no need to start the new iteration at the reset state. Instead the SAR 14 can continue to the next bit of the new iteration, skipping some of the pump-up/down operations. This was seen in the secondary example provided above where the analog input was 0.76 V. At the conclusion of the second iteration, the DAC was state 12 (0.75 V). The DAC could advantageously proceed to state 14 without traversing back up to the reset state and then to state 8, 12, and then to state 14. This elimination can result in a saving of 3 cycles (to reset, to state 8, and to state 12). This elimination occurs because the appended bits of the comparator output at the end of the second iteration were 11, which results in a mirror image of 11, which would place the DAC at the same location on the tree, i.e., state 12. This implementation can also reduce power required by the ADC.

Figure 10:
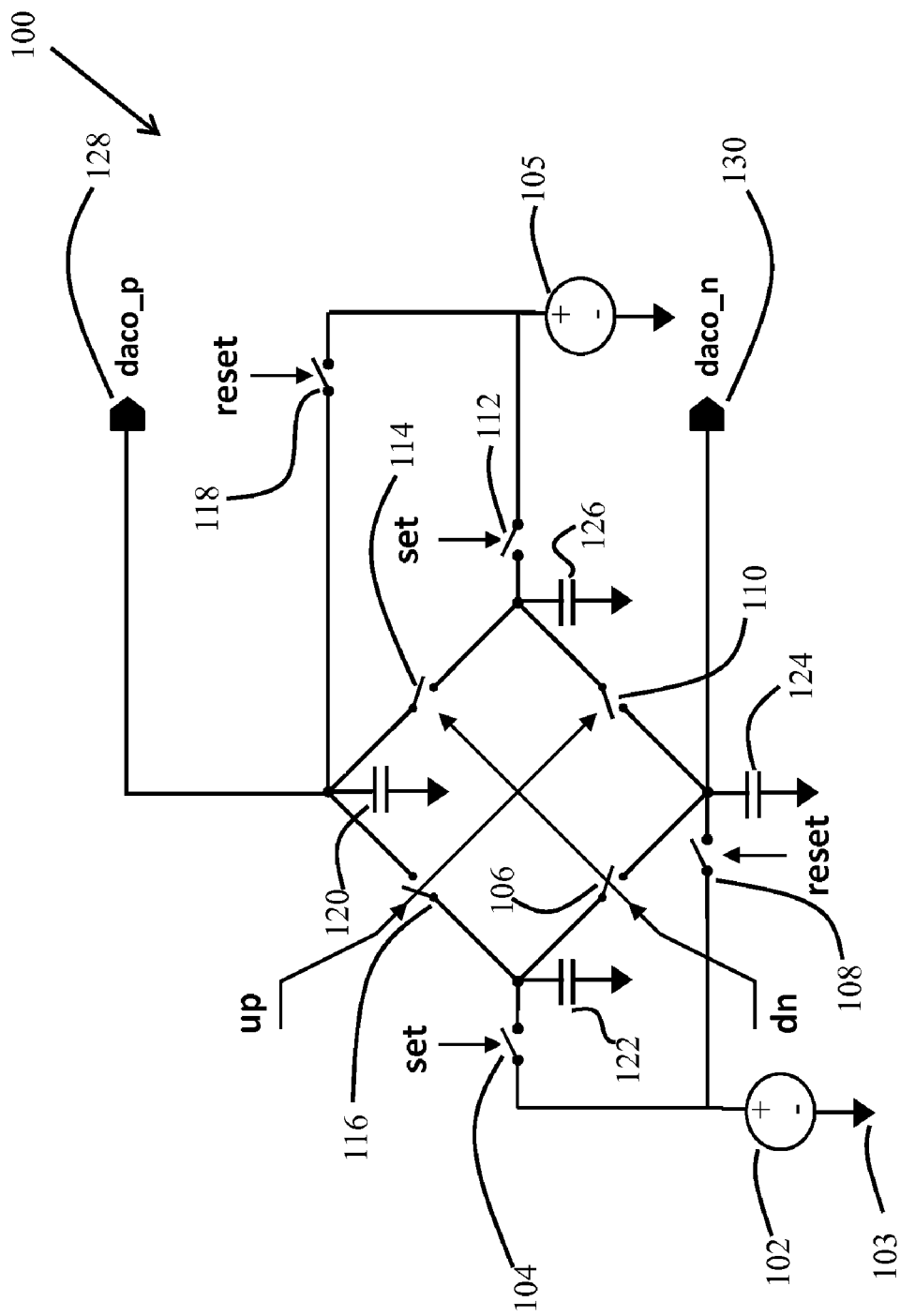
FIG. 10 is a schematic representation of a differential DAC according to the current teachings.

In another embodiment, a differential scheme is provided to enhance the ADC's operation. Differential signals improve noise immunity of the DAC. In applications where the DAC's reference voltages are relatively low in amplitude, ground jitter can be disruptive. The noise immunity can be improved by implementing a differential DAC which uses a high and a low reference voltage. A differential DAC 100 is shown in FIG. 10. In the differential embodiment eight switches (104, 106, 108, 110, 112, 114, 116, and 118) are used to interconnect four capacitors (120, 122, 124, and 126) to each other, to $V_{Pref}$ 102, and to $V_{Nref}$ 105. Two ADC differential outputs (128 and 130) are provided. The differential scheme shown in FIG. 10 is an improvement over the single ended approach provided in FIG. 4 because the differential approach eliminates inaccuracies due to charge injection. The differential scheme shown in FIG. 10 allows the DAC output range to be doubled. For example, by selecting 1 V and 0 for $V_{Pref}$ and $V_{Nref}$, respectively, it is possible for the DAC of FIG. 10 to have a range of +1 to −1, rather than +1 to 0 for FIG. 4, thereby doubling the range. Charge injections in single ended applications shown in FIGS. 2 and 4 can result in offsets at the comparator input 28 (see FIG. 3) which can result in inaccuracies. Implementing the differential DAC in a differential ADC, according to FIG. 11, can eliminate these offsets.

Figure 11:
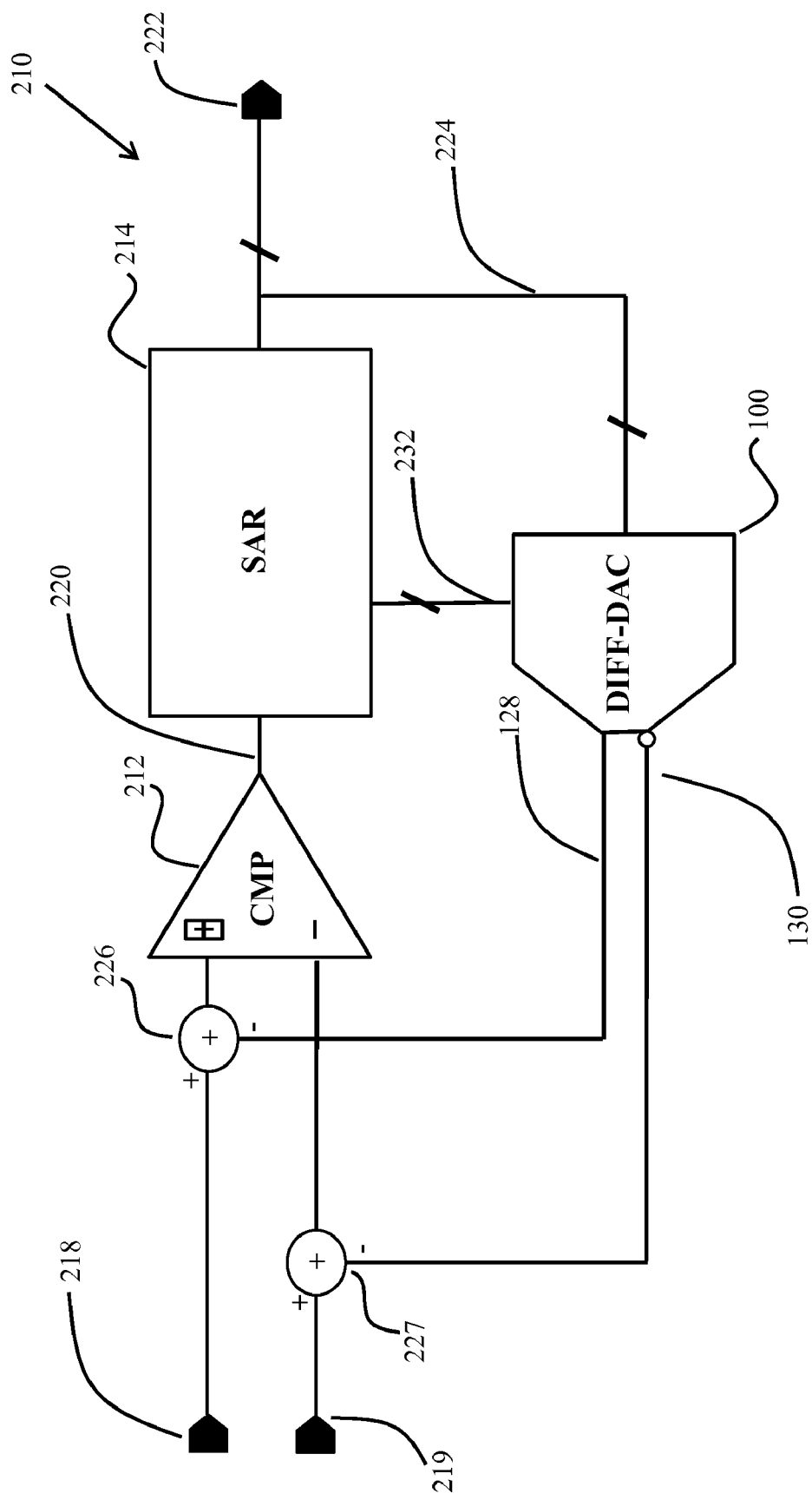
FIG. 11 is a block diagram representation of component connectivity for an embodiment according to the current teachings.

Referring to FIG. 11, adders 226 and 227 sum differential outputs 128 and 130 of the differential DAC 100 with analog inputs 218 and 219, respectively. In one embodiment the adders can be unity gain operational amplifiers. In another embodiment the adders can be implemented by switches. Analog signals 218 and 219 are differential analog inputs from a source producing differential signals. Therefore, the analog signals 218 and 219 are opposite signals about a voltage level, i.e., a differential ground. The circuit in FIG. 11 can be compared and therefore made equivalent to the circuit in FIG. 3 by letting one of the differential inputs, e.g., 219, along with the complementary DAC output that is coupled to the other differential input, e.g., 128, to be ground lines. The adder outputs are fed to the comparator 212 producing a digital comparator output 220. The SAR 214 successively captures the output 220 and produces a digital conversion at ADC output 222. The SAR 214 controls the switches of the DAC 100 by the control lines 232, while providing digital values to the SAR 100 by data lines 224. The resulting binary tree is similar to that shown in FIG. 8.

Figure 12:
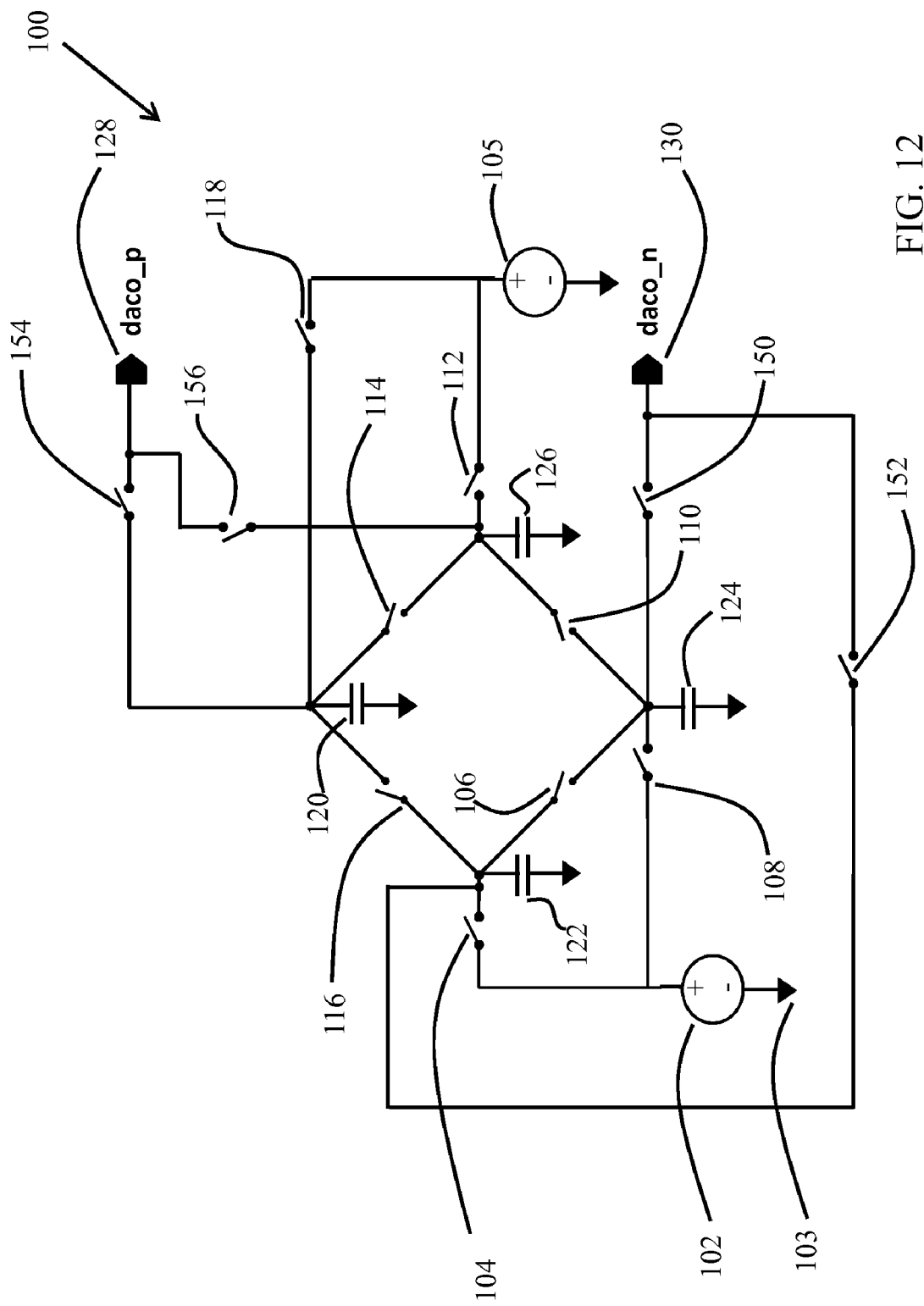
FIG. 12 is a schematic representation of a differential DAC using dynamic element matching.

In one embodiment, a dynamic element matching scheme is used to reduce the mismatch between the capacitors, and thereby improve the accuracy of the ADC/DAC. To achieve improved accuracy the capacitors need to be matched. The capacitors may be physically matched; however, physical matching requires larger footprints for the capacitors. In some applications increasing the size of the capacitors may be prohibitive. Alternatively, the capacitors can be dynamically matched in applications where the number of cycles required to arrive at a digital value for an analog input is not critical. Referring to FIG. 12, the differential schematic of FIG. 10 is reproduced with minor differences directed to dynamic element matching. For example, capacitors 122 and 124 are switchable to the daco_n output 130 via switches 152 and 150, respectively. Similarly, capacitors 120 and 126 are switchable to the daco_p output 128 via switches 154 and 156, respectively. The additional switches 150, 152, 154, and 156 are included as part of the dynamic element matching scheme, described below. In one form, dynamic element matching of capacitors is achieved by converting an analog input to a digital number in two sequences. In the first sequence, the analog input is converted to a first digital number using one set of capacitors as charge/discharge capacitors, e.g., 120 and 122, and another set as output capacitors, e.g., 124 and 126. In the second sequence, the two set of capacitors are switched and a second digital number is determined. These digital numbers can then be averaged to produce the result. Converting the analog input twice requires about twice the number of convergence cycles discussed above. Therefore, the added accuracy resulting from averaging the two digital numbers comes at a cost of longer convergence time.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

We claim:

1. An analog to digital converter comprising:
a comparator having a first input, a second input and an output, the first input being coupled to an analog signal;
a successive approximation register having a serial input coupled to the output of the comparator, and being configured to generate a plurality of control signals and an N-bit digital value corresponding to the analog signal; and
a digital to analog converter having an input coupled to the plurality of control signals, the digital to analog converter further comprising a first, a second, and a third capacitor and a plurality of switches controlled by the plurality of control signals and being configured to couple the first capacitor to the second capacitor and the third capacitor to the second capacitor in a mutually exclusively manner to share charge on the first capacitor and charge on the third capacitor with charge on the second capacitor and to generate an analog signal on the second capacitor, the second capacitor being coupled to the second input of the comparator.

2. The analog to digital converter of claim 1, wherein the first capacitor is selectively coupled to a high reference voltage by one of the plurality of switches in response to one control signal of the plurality of control signals.

3. The analog to digital converter of claim 2, wherein the third capacitor is selectively coupled to an low reference voltage by one of the plurality of switches in response to one control signal of the plurality of control signals.

4. The analog to digital converter of claim 3, wherein the successive approximation register generates a combination of the plurality of control signals that operates the plurality of switches to place the digital to analog converter in a pump-up state, in the pump-up state the first capacitor is decoupled from the high reference voltage and afterwards coupled to the second capacitor and the third capacitor is decoupled from the second capacitor and coupled to the low reference voltage.

5. The analog to digital converter of claim 3, wherein the successive approximation register generates a combination of the plurality of control signals that operates the plurality of switches to place the digital to analog converter in a pump-down state, in the pump-down state the first capacitor is decoupled from the second capacitor and afterwards coupled to the high reference voltage and the third capacitor is decoupled from the low reference voltage and coupled to the second capacitor.

6. The analog to digital converter of claim 4, wherein the successive approximation register generates a combination of the plurality of control signals to place the digital to analog converter in a reset state, in the reset state the second capacitor is decoupled from the first and third capacitors, the second and third capacitors are coupled to the low reference voltage, and the first capacitor is coupled to the high reference voltage.

7. The analog to digital converter of claim 6, wherein the successive approximation register generates a combination of the plurality of control signals to place the digital to analog converter in the pump-up state after the reset state.

8. The analog to digital converter of claim 7, the successive approximation register further comprising an output register, the output register being coupled to the output of the comparator to append the output of the comparator N times serially to form the N-bit digital value, the register placing the digital to analog converter in the reset state after each time the output of the comparator is appended and after each reset state the register generates the plurality of control signals to form a pump sequence corresponding to a mirror image of the appended bits.

9. The analog to digital converter of claim 8, wherein for each bit of the pump sequence the digital to analog converter is placed in the pump-down state in response to the bit being zero, and the digital to analog converter is placed in the pump-up state in response to the bit being one.

10. The analog to digital converter of claim 9, wherein each bit of the pump sequence is presented to the digital to analog converter with reference to a predefined time interval.

11. The analog to digital converter of claim 10, wherein the register outputs the N-bit digital value at the first output of the register with a latency of $$N + \sum_{n=1}^{N} n$$

predefined time intervals.

12. The analog to digital converter of claim 11, wherein the register outputs the N-bit digital value at the first output of the register with a latency of $$(N-1) + \sum_{n=2}^{N} n$$

predefined time intervals.

13. The analog to digital converter of claim 10, the successive approximation register further comprising a clock signal generator that provides a clock period corresponding to the predefined time interval.

14. The analog to digital converter of claim 10, the successive approximation register further comprising a timer that provides a timeout period corresponding to the predefined time interval.

15. The analog to digital converter of claim 14, the comparator further comprising a third input coupled to the successive approximation register and configured to provide a trigger signal to the comparator the comparator comparing the first and the second inputs in reference to one state of the trigger signal and latching the output of the comparator in response to a predetermined amount of time after the one state of the trigger signal.

16. The analog to digital converter of claim 15, wherein the comparator further comprising a second output coupled to the successive approximation register and configured to provide a ready signal to the successive approximation register to indicate that the output of the comparator is valid.

17. An analog to digital converter comprising:
a first adder configured to generate a sum of a first analog signal and a second analog signal;
a second adder configured to generate a sum of a third analog signal and a fourth analog signal;
a comparator configured to compare the sum of the first and the second analog signals with the sum of the third and the fourth analog signals;
a successive approximation register coupled to the comparator and being configured to generate a plurality of control signals and an N-bit digital value corresponding to the first and the third analog signals in response to the comparison performed by the comparator; and
a differential digital to analog converter coupled to the plurality of control signals, the digital to analog converter further comprising a first, a second, a third, and a fourth capacitor and a plurality of switches controlled by the plurality of control signals and being configured to couple the first and the third capacitors to the second capacitor, and to couple the first and the third capacitors to the fourth capacitor in a mutually exclusively manner to share charge on the first capacitor and charge on the third capacitor with charges on the second and fourth capacitors and to generate the second analog signal on the second capacitor and the fourth analog signal on the fourth capacitor.

18. An analog to digital converter comprising:
a first adder configured to generate a sum of a first analog signal and a second analog signal;
a second adder configured to generate a sum of a third analog signal and a fourth analog signal;
a comparator configured to compare the sum of the first and the second analog signals and the sum of the third and the fourth analog signals;
a successive approximation register coupled to the comparator and being configured to generate a plurality of control signals and an N-bit digital value corresponding to the first and the third analog signals in response to the comparison performed by the comparator; and
a differential digital to analog converter coupled to the plurality of control signals, the differential digital to analog converter further comprising a first, a second, a third, and a fourth capacitor and a plurality of switches controlled by the plurality of control signals to toggle selectively between a first sequence and a second sequence, in the first sequence the plurality of switches couple the first and the third capacitors to the second capacitor and couple the first and the third capacitors to the fourth capacitor in a mutually exclusively manner to share charge on the first capacitor and charge on the third capacitor with charges on the second and fourth capacitors and to generate the second analog signal on the second capacitor and the fourth analog signal on the fourth capacitor, in the second sequence the plurality of switches couple the second and the fourth capacitors to the first capacitor and couple the second and the fourth capacitors to the third capacitor in a mutually exclusively manner to share charge on the second capacitor and charge on the fourth capacitor with charges on the first and the third capacitors and to generate the second analog signal on the first capacitor and the fourth analog signal on the third capacitor.

19. The analog to digital converter of claim 18, further comprising:

a memory device for storing the N-bit digital value as a first digital value corresponding to the first sequence and for storing the N-bit digital value as a second digital value corresponding to the second sequence.

20. The analog to digital converter of claim 19, further comprising:

a processor configured to average the first digital value and the second digital value to produce an N-bit digital output corresponding to the first and the third analog inputs.

* * * * *